US005668744A

United States Patent [19]

Varadan et al.

[11] Patent Number: 5,668,744

[45] Date of Patent: Sep. 16, 1997

[54] ACTIVE NOISE CONTROL USING PIEZOELECTRIC SENSORS AND ACTUATORS

[75] Inventors: Vijay K. Varadan; Vasundara V. Varadan; Xiao-Qi Bao, all of State College, Pa.; Kenneth B. Carney, Granville, Ohio; John L. Olinger; Fred S. Coffey, both of Newark, Ohio

[73] Assignee: Owens-Corning Fiberglas Technology Inc., Summit, Ill.

[21] Appl. No.: 437,122

[22] Filed: May 5, 1995

[51] Int. Cl.$^6$ .......... H03F 1/26

[52] U.S. Cl. .......... 364/574; 364/508

[58] Field of Search .......... 364/574, 508, 364/474.16, 474.17, 474.19; 381/71, 73.1, 94, 86, 93, 190; 415/119; 367/901

[56] References Cited

U.S. PATENT DOCUMENTS

| | | | |
|---|---|---|---|
| 4,442,323 | 4/1984 | Yoshida et al. . | |
| 4,558,249 | 12/1985 | Lerch et al. . | |
| 4,641,054 | 2/1987 | Takahata et al. . | |
| 4,899,387 | 2/1990 | Pass . | |
| 5,133,017 | 7/1992 | Cain et al. . | |
| 5,161,200 | 11/1992 | Barr . | |
| 5,224,168 | 6/1993 | Martinez et al. . | |
| 5,245,664 | 9/1993 | Kinoshite et al. . | |
| 5,251,264 | 10/1993 | Tichy . | |
| 5,325,437 | 6/1994 | Doi et al. | 381/71 |
| 5,355,917 | 10/1994 | Burdisso et al. . | |
| 5,363,451 | 11/1994 | Martinez et al. . | |
| 5,363,452 | 11/1994 | Anderson . | |
| 5,370,340 | 12/1994 | Pla . | |
| 5,371,801 | 12/1994 | Powers et al. . | |
| 5,382,134 | 1/1995 | Pla et al. . | |
| 5,386,689 | 2/1995 | Bozich et al. . | |

OTHER PUBLICATIONS

"Fiber Glass" by J. Gilbert Mohr and William R. Rowe 1978 Published by Van Nostrand Co., New York, New York.

"Active Noise Control Using Piezoelectric Actuator for a Machine" SPIE vol. 2189/211 date May 5, 1994.

"The Bose Aviation Headset" Bose Corporation date unknown.

*Primary Examiner*—James P. Trammell

*Attorney, Agent, or Firm*—C. Michael Gegenheimer; Inger H. Eckert

[57] ABSTRACT

A method for reducing noise generated by the operation of a noise-producing machine includes sensing the noise of the machine with a piezoelectric sensor, sending an activation signal, responsive to the sensed noise of the machine, to activate a piezoelectric actuator to reduce the noise of the machine, where the piezoelectric actuator is independent of a wave guide. Further, a parameter of the machine indicative of the speed of the machine is sensed with a second sensor, and the activation signal is corrected, responsive to the sensed parameter of the machine, to optimize the noise reduction of the piezoelectric material.

20 Claims, 2 Drawing Sheets

ACTIVE NOISE CONTROL USING PIEZOELECTRIC SENSORS AND ACTUATORS

TECHNICAL FIELD

This invention pertains to the control of unwanted noise generated by a noise-producing machine. More particularly, this invention pertains to the active control of noise using an activator in response to sensed noise.

BACKGROUND

Conventional methods for controlling noise generally involve passive systems, which may include noise absorption or attenuation members, such as fiberglass ceiling panels or thick carpets. Other passive systems include noise baffles, such as sound deflecting highway barriers. In industrial settings, noise due to the operation of machines can be annoying to neighboring residences. Excessive noise can also potentially cause damage to the hearing of workers due to over-exposure at the workplace. Efforts to curb excessive noise in recent years have included active noise systems which sense the noise from a noise source and create a negative or inverse noise to act as a canceling force.

One known noise reduction technique is to use conventional microphones for sensing the unwanted noise and conventional speakers as actuators for broadcasting the negative or inverse of the noise sensed through the microphones to cancel or block out the noise. Microphone/speaker systems have only limited application because it is usually impossible to place the speakers in the same location as the source of the unwanted noise. Since the source and the speakers cannot be at the same locus, there are blind areas, nodes, and areas of overlap which result in uneven canceling of noise, and even areas where the noise is enhanced rather than reduced.

Microphone/speaker systems are most practical when operated within a controlled environment, such as a small enclosure, a chamber, or a waveguide. One notable success for microphone/speaker systems includes personal noise suppressers such as used by airplane pilots. This application obtains good results because the canceling noise can be delivered to a specific target, the human ear, at close range. Another success for a microphone/speaker system is the active noise canceling of noise in a waveguide such as an air conditioning duct. The controlled structure of the duct enables the canceling noise to have the same effect as if it had originated from the same locus as the source of the unwanted noise.

Microphone/speaker systems are not successful outside confined environments where the unwanted noise is broadcast generally, and where the noise must be reduced over a wide open area. Further, conventional microphones and speakers are relatively fragile, and are not suitable for hostile environments, such as wet, dusty, excessively warm, or vibrating environments. In these environments heavy duty sensors and actuators are required.

Recent developments in noise control have resulted in the use of piezoelectric devices for both sensors and actuators in active noise control systems. In U.S. Pat. No. 5,355,417, Burdisso et al. suggest the use of an array of piezoelectric (PZT) actuators positioned on the inner surface of a jet engine inlet cylinder to provide an interfering or canceling noise field. An additional array of sensors provides feedback information to a controller, which controls the input signals to the PZT actuators. The sensors taught are eddy current sensors which measure the fan speed and generate a signal which is correlated with radiated sound, i.e., an algorithm imputes a sound signal based on the measured fan speed. The error sensors taught are microphones, a preferred version of which is a polyvinyldi-flouride (PVDF) strain-induced film. The range of frequency taught is from 2000 to 4000 Hz.

Although the Burdisso et al. system has been shown to be effective for jet engine inlets, the interfering noise is distributed within a waveguide, i.e., the cylindrical jet engine inlet. It would be advantageous to be able to provide a noise cancellation system which would be effective outside a waveguide.

In U.S. Pat. No. 5,370,340, Pla discloses a jet engine noise suppression system using PZT noise sensors and PZT actuators, and a controller which sends a control signal to the PZT actuators in response to the noise sensed by the PZT sensors. The noise sensors can be set up to sense the air-borne noise or the actual vibration (structure-home excitation) of the jet engine. A tachometer provides input regarding the fan rotation rate to the controller. The PZT actuators are designed to provide good impedance matching with the acoustic field inside the engine shroud. The disclosure is limited, however, to noise cancellation systems in a waveguide.

It would be advantageous to have a system for eliminating or reducing unwanted noise for use in non-waveguide applications. Such a system should be capable of operating in harsh environments.

DISCLOSURE OF INVENTION

There has now been developed a method for reducing noise generated by the operation of a noise-producing machine which does not require a waveguide, and which can effectively operate in a hostile environment. The method includes the steps of sensing the noise of the machine with a piezoelectric sensor, and sending an activation signal, responsive to the sensed noise of the machine, to activate a piezoelectric actuator to reduce the noise of the machine. A control circuit provides the actuator with a driving signal in the appropriate phase and amplitude, and the actuator creates a second field to eliminate some of the sound pressure from the noise source. The piezoelectric actuator is independent of a wave guide and therefore can act to reduce noise from sources which are not contained within waveguides. A parameter of the machine indicative of the speed of the machine is sensed with a second sensor, and the activation signal is corrected, responsive to the sensed parameter of the machine, to optimize the noise reduction of the piezoelectric material.

In a particular embodiment of the invention, a portion of the machine is rotating and the parameter sensed is the rotational speed of the machine. The rotational speed of the machine can be sensed with an optical sensor.

In another embodiment of the invention, the activation signal includes a component characteristic of the fundamental frequency of the noise produced by the machine, and a component characteristic of at least one harmonic of the fundamental frequency, to reduce the noise at the harmonics of the fundamental frequency. An additional piezoelectric sensor can be used to sense the noise of at least one of the harmonics of the fundamental frequency, and a signal responsive to the sensed noise can be sent to an additional piezoelectric actuator.

In yet another embodiment of the invention, the piezoelectric sensor senses both air-borne and structural-borne noise. The piezoelectric sensor can be attached to the machine to sense the combined air-borne and structural-borne noise of the machine.

In yet another embodiment of the invention, the machine is of the type which produces periodic noise bursts. In one particular embodiment, the machine causes periodic impacts of one machine element against another, thereby producing periodic noise bursts. The machine can be a chopper for chopping glass fiber strand into chopped glass fibers.

BEST MODE FOR CARRYING OUT THE INVENTION

The invention will be described in conjunction with a glass fiber chopping process and apparatus. It is to be understood that the invention will function just as well with noise-producing machines which are not choppers.

Figure 1:
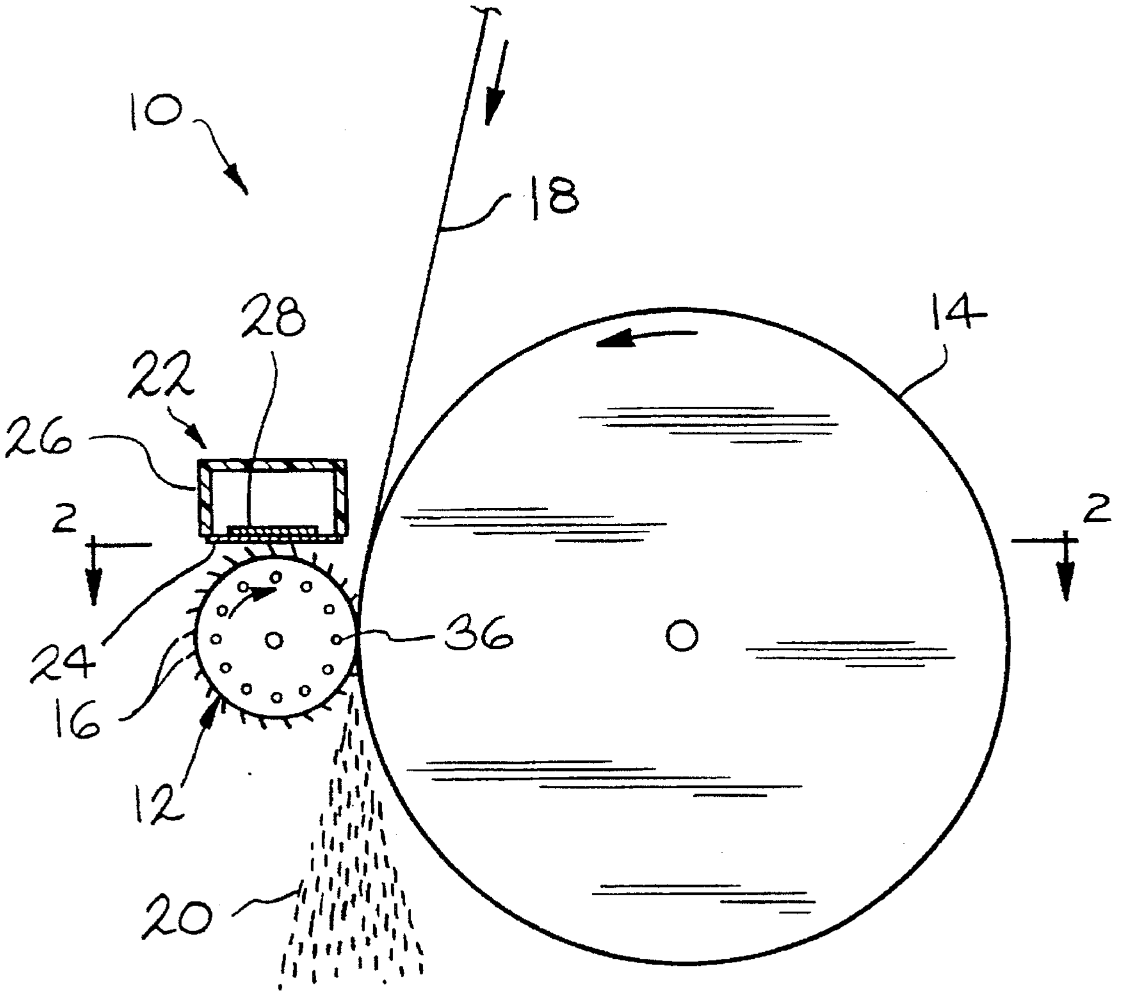
FIG. 1 is a schematic view in elevation showing a chopper for glass fibers in combination with apparatus for reducing noise according to the method of the invention.
Figure 2:
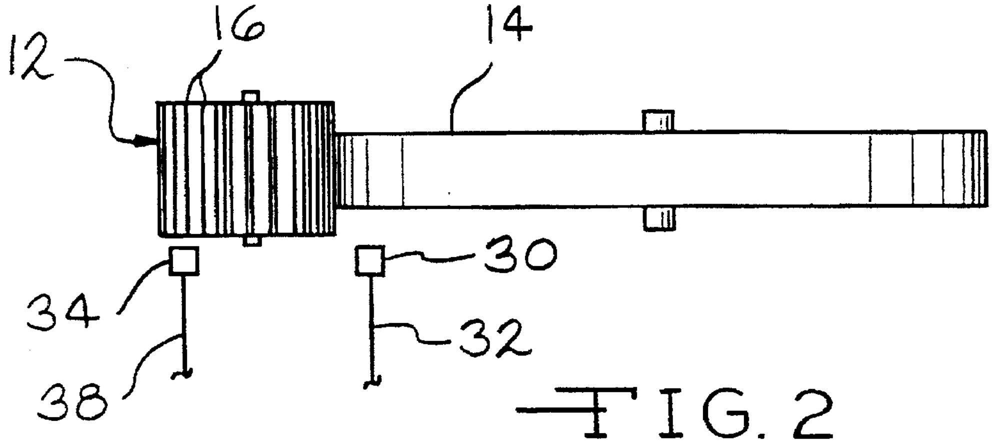
FIG. 2 is a cross-sectional view of the chopper taken along line 2—2 of FIG. 1.

As shown in FIGS. 1 and 2, the chopper is generally indicated at 10. The chopper is comprised of cutter roll 12 and cot wheel 14, both of which are mounted for rotation on axes which are generally parallel to each other. The cutter roll has many blades 16 projecting outwardly, and the blades cut the continuous strand 18 into discrete or chopped fibers 20 as the strand goes between the cutter roll and the cot wheel. The cot wheel can be surfaced by any suitable material. Either the cutter roll or the cot wheel, or both, can be driven by a motor, not shown, to cause rotation. The operation of the chopper apparatus is very well known to those skilled in the art of manufacturing glass fibers.

The noise level of a glass fiber chopper is in excess of 90 dBA. The cutter roll has anywhere from about 6 to about 200 blades, and a rotation rate of from about 1000 linear feet of strand per minute (about 1000 rpm) to about 7500 feet per minute (about 7500 rpm). Each time one of the chopper blades strikes the cot wheel and cuts the strand, there is a noise burst. The rapid rotation of the cutter roll produces periodic occurrences of these noise bursts, as many as from about 100 to about 2500 per second.

Positioned above the cutter roll is the actuator 22 which reduces the noise of the chopper 10. The actuator is comprised of a plate 24, a housing 26, and a piezoelectric material 28. The purpose of the housing is to protect the PZT material from the elements inherent in a hostile work environment. The housing can be made of any suitable material, such as plastic or aluminum. The plate can be any suitable flexible material, such as a thin brass plate, although other metallic and non-metallic materials can be used. The plate and the PZT material act as a bending mode vibrator. The actuator is described in greater detail in a paper authored by some of the inventors and published May 5, 1994, by the SPIE (International Society for Optical Engineering). The paper is entitled "Active Noise Control Using Piezoelectric Actuator for a Machine", and the paper is hereby incorporated by reference.

The piezoelectric material is a ceramic material, and preferably a lead zirconate titanate. Other types of piezoelectric material can be used. A preferred type for the actuator is a PZT type IV from American Piezo Ceramics, Bellefonte, Pa. A PZT type V is preferred for the sensor.

It can be seen that neither the source of the unwanted noise (i.e., the impact of the chopper blades on the cot wheel) nor the PZT actuator is positioned within a wave guide. The actuator is merely positioned near the noise source to provide a pressure field which reduces the overall noise from the chopper.

A computer program, based on finite element analysis, is preferably used to design the shape and properties of the PZT material 28 and the brass plate 26 so that they will have a resonance frequency which conforms to the expected frequency and amplitude of the unwanted noise from the chopper. It is important that the actuator match the impedance of the sound generated by the chopper. The impedance is proportional to the pressure of the sound waves and inversely proportional to the velocity of the sound.

A sensor 30 is positioned very close to the point of impact of the cutter roll blades 16 on the cot wheel to sense the noise of the chopper 10. The sensor 30 is a PZT sensor similar to the PZT actuator 22, and it produces a signal responsive to the sensed noise of the chopper. The signal is sent to a controller, which can be a general purpose computer.

The rotation rate of the cutter roll is subject to slight variability during the chopping operation. The variability in rotation rates may occur for several reasons, including electrical current/frequency variations, changes in the thickness or chopping resistance of the glass fiber strand, and frictional resistance changes in the motor or rotating cutter roll or cot wheel. In order to be sure that the signals to the actuator are timed perfectly with the periodic noise bursts of the chopper, some means for sensing the speed of the chopper is required. This can be accomplished by sensing a parameter of the machine which is indicative of the speed. Such a parameter could be a measure of the electric current passing through the machine. Another parameter could be the rotation rate of a rotating element of the machine. As shown in FIG. 2, a sensor, such as optical sensor 34, can be used to measure the rotational speed of the cutter roll, which is a parameter of the machine (i.e., the chopper). The optical sensor can be mounted adjacent the machine to count or otherwise measure the rotation rate of indicator marks, such as marks 36, on the cutter roll. The optical sensor 34 can be connected to the controller, not shown, by lead wire 38.

Figure 3:
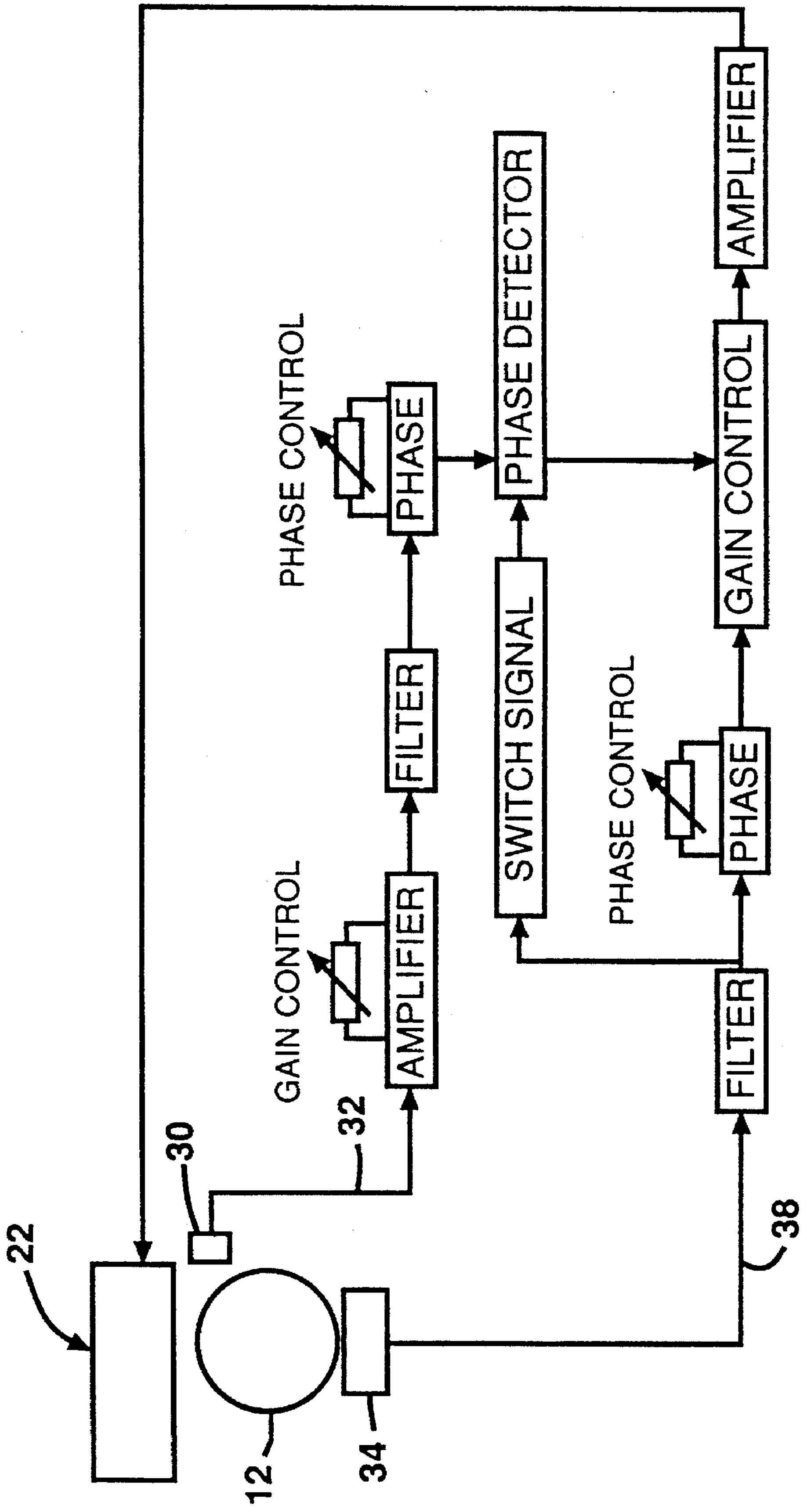
FIG. 3 is a schematic flow chart illustrating the control logic of the invention.

The purpose of the control circuit shown in FIG. 3 is to provide the actuator with a driving signal in the appropriate phase and amplitude so that the actuator creates a second field to eliminate some of the sound pressure from the noise source. The control circuit can be either digital or analog. The signal from the optical sensor 34 is first passed through an amplifier which amplifies it, and the signal is converted to a square wave form. The square wave is filtered to become a sine wave with a frequency corresponding to the fundamental frequency of the noise source with a constant amplitude and a phase correlated to the running phase of the chopper. The signal is fed to the actuator 22 through a phase shifter, a gain control device and a power amplifier. The phase shifter and the gain control device provide the capability to provide a signal with the amplitude and phase that are required for noise elimination or reduction.

The output of the noise sensor 30 is first amplified by the gain control amplifier. The signal is passed through a filter which limits the signal to the component corresponding to the dominating frequency. The phase shifter or phase control is adjusted to make the phase of this component to be the same as that of the signal from the optical sensor. Then through the phase detector, which uses the switch signal from the optical sensor as a reference signal, the signal becomes a dc voltage that is used to control the gain control. The gain control increases the output when the dc voltage is positive and decreases when negative to get the maximum reduction in the fundamental frequency.

In some cases it is possible that the noise produced by the noise-producing machine has not only a fundamental frequency, but also has one or more harmonics of the fundamental frequency. In that case, it may be desirable to provide an activation signal which includes a component characteristic of the fundamental frequency of the noise produced by the machine, and a component characteristic of at least one harmonic of the fundamental frequency, to reduce the noise at the harmonics of the fundamental frequency. An additional piezoelectric sensor, not shown, can be used to sense the noise of at least one of the harmonics of the fundamental frequency, and a signal responsive to the sensed noise can be sent to an additional piezoelectric actuator, not shown.

In some instances the machine will be experiencing structural vibration as well as creating sound waves through the air. The piezoelectric sensor can be adapted to sense both air-borne and structural-borne noise. The piezoelectric sensor can be attached to the machine to sense the combined air-borne and structural-borne noise of the machine.

It will be evident from the foregoing that various modifications can be made to this invention. Such, however, are considered as being within the scope of the invention.

INDUSTRIAL APPLICABILITY

The invention will be found to be useful in reducing the noise of textile choppers for cutting continuous glass fiber strands into discrete lengths, and for reducing the noise of other noise-producing machines.

We claim:

1. A method for reducing noise generated by the operation of a noise-producing machine comprising:

sensing the noise of the machine with a piezoelectric sensor;

sending an activation signal, responsive to the sensed noise of the machine, to activate a piezoelectric actuator to reduce the noise of the machine, where the piezoelectric actuator is independent of a wave guide;

sensing a parameter of the machine indicative of the speed of the machine with a second sensor; and correcting the activation signal, responsive to the sensed parameter of the machine, to optimize the noise reduction of the piezoelectric material.

2. The method of claim 1 in which a portion of the machine is rotating and the parameter sensed is the rotational speed of the machine.

3. The method of claim 2 comprising sensing the rotational speed of the machine with an optical sensor.

4. The method of claim 1 in which the activation signal includes a component characteristic of the fundamental frequency of the noise produced by the machine, and a component characteristic of at least one harmonic of the fundamental frequency, to reduce the noise at the harmonies of the fundamental frequency.

5. The method of claim 4 comprising reducing the noise at at least one of the harmonics of the fundamental frequency by sensing the noise of at least one of the harmonics of the fundamental frequency with an additional piezoelectric sensor and sending a signal responsive to the sensed noise to an additional piezoelectric actuator.

6. The method of claim 1 in which the piezoelectric sensor senses both air-borne and structural-borne noise.

7. The method of claim 1 comprising sensing the combined noise of the machine with the piezoelectric sensor by attaching the piezoelectric sensor to the machine and sensing the vibration of the machine with the piezoelectric sensor.

8. The method of claim 7 in which the second noise sensor also senses air-borne noise generated by the machine.

9. A method for reducing noise generated by the operation of a noise-producing machine, where the machine produces periodic noise bursts, comprising:

sensing the noise of the machine with a piezoelectric sensor;

sending an activation signal, responsive to the sensed noise of the machine, to activate a piezoelectric actuator to reduce the noise of the machine;

sensing a parameter of the machine indicative of the frequency of the noise bursts with a second sensor; and correcting the activation signal, responsive to the sensed parameter of the machine, to optimize the noise reduction of the piezoelectric material.

10. The method of claim 9 in which a portion of the machine is rotating and the parameter sensed is the rotational speed of the machine.

11. The method of claim 10 comprising sensing the rotational speed of the machine with an optical sensor.

12. The method of claim 9 in which the activation signal includes a component characteristic of the fundamental frequency of the noise produced by the machine, and a component characteristic of at least one harmonic of the fundamental frequency, to reduce the noise at the harmonics of the fundamental frequency.

13. The method of claim 12 comprising reducing the noise at at least one of the harmonics of the fundamental frequency by sensing the noise of at least one of the harmonics of the fundamental frequency with an additional piezoelectric sensor and sending a signal responsive to the sensed noise to an additional piezoelectric actuator.

14. The method of claim 9 in which the machine is a chopper for chopping glass fiber strand into chopped glass fibers.

15. A method for reducing noise generated by the operation of a noise-producing machine, where the machine causes periodic impacts of one element against another, thereby producing periodic noise bursts, comprising:

sensing the noise of the machine with a piezoelectric sensor;

sending an activation signal, responsive to the sensed noise of the machine, to activate a piezoelectric actuator to reduce the noise of the machine;

sensing the frequency of the impacts with a second sensor; and correcting the activation signal, responsive to the sensed parameter of the machine, to optimize the noise reduction of the piezoelectric material.

16. The method of claim 15 in which a portion of the machine is rotating and the parameter sensed is the rotational speed of the machine.

17. The method of claim 16 comprising sensing the rotational speed of the machine with an optical sensor.

18. The method of claim 15 in which the activation signal includes a component characteristic of the fundamental frequency of the noise produced by the machine, and a component characteristic of at least one harmonic of the fundamental frequency, to reduce the noise at the harmonics of the fundamental frequency.

19. The method of claim 18 comprising reducing the noise at at least one of the harmonics of the fundamental frequency by sensing the noise of at least one of the harmonics of the fundamental frequency with an additional piezoelectric sensor and sending a signal responsive to the sensed noise to an additional piezoelectric actuator.

20. The method of claim 15 in which the machine is a chopper for chopping glass fiber strand into chopped glass fibers.

* * * * *

UNITED STATES PATENT AND TRADEMARK OFFICE

CERTIFICATE OF CORRECTION

PATENT NO. : 5,668,744

DATED : September 16, 1997

INVENTOR(S) : Vijay K. Varadan, Vasundara V. Varadan, Xiao-Qi Bao, Kenneth B. Carney John L. Olinger, Fred S. Coffey It is certified that error appears in the above-identified patent and that said Letters Patent is hereby corrected as shown below:

In Claim 4, line 5, "harmonies" should be - -harmonics- -.

Signed and Sealed this

Twentieth Day of January, 1998

Attest:

BRUCE LEHMAN

*Attesting Officer*

*Commissioner of Patents and Trademarks*